(12) United States Patent
Yoshida et al.

(10) Patent No.: US 6,842,023 B2
(45) Date of Patent: Jan. 11, 2005

(54) PROBE CARD APPARATUS AND ELECTRICAL CONTACT PROBE HAVING CURVED OR SLOPING BLADE PROFILE

(75) Inventors: Minoru Yoshida, Yokohama (JP); Seiichi Ohashi, Yokohama (JP)

(73) Assignee: Innotech Corporation, Yokohama (JP)

( * ) Notice: Subject to any disclaimer, the term of this patent is extended or adjusted under 35 U.S.C. 154(b) by 0 days.

(21) Appl. No.: 10/257,334

(22) PCT Filed: Jan. 15, 2001

(86) PCT No.: PCT/JP01/00208

§ 371 (c)(1),
(2), (4) Date: Oct. 9, 2002

(87) PCT Pub. No.: WO01/79865

PCT Pub. Date: Oct. 25, 2001

(65) Prior Publication Data

US 2003/0098700 A1 May 29, 2003

(30) Foreign Application Priority Data

Apr. 13, 2000 (JP) ........................................ 2000-112268
Jul. 21, 2000 (JP) ........................................ 2000-220603

(51) Int. Cl.[7] .............................................. G01R 31/02
(52) U.S. Cl. ...................... 324/754; 324/761; 324/762
(58) Field of Search ............................... 324/72.5, 754, 324/757–758, 761–762, 765; 439/482; 29/842, 847, 849

(56) References Cited

U.S. PATENT DOCUMENTS

| | | | |
|---|---|---|---|
| 4,321,122 A | * | 3/1982 | Whitcomb et al. ......... 204/400 |
| 4,593,243 A | | 6/1986 | Lao et al. |
| 5,436,571 A | | 7/1995 | Karasawa |
| 5,773,987 A | * | 6/1998 | Montoya ..................... 324/757 |
| 5,932,323 A | * | 8/1999 | Throssel ..................... 428/209 |
| 6,433,571 B1 | * | 8/2002 | Montoya ..................... 324/762 |
| 6,633,176 B2 | * | 10/2003 | Takemoto et al. .......... 324/754 |

FOREIGN PATENT DOCUMENTS

| | | |
|---|---|---|
| EP | 0893695 | 1/1999 |
| JP | 63262849 | 10/1988 |
| JP | 2-663 | 1/1990 |
| JP | 04100251 | 4/1992 |
| JP | 06249880 | 9/1994 |
| JP | 07043384 | 2/1995 |
| JP | 08035986 | 2/1996 |
| JP | 09115970 | 5/1997 |
| JP | 10026635 | 1/1998 |
| JP | 10185951 | 7/1998 |
| JP | 11211753 | 8/1999 |
| JP | 2000321303 | 11/2000 |
| JP | 2001050979 | 2/2001 |
| WO | WO 99/36790 | 7/1999 |

* cited by examiner

Primary Examiner—Minh N. Tang
(74) Attorney, Agent, or Firm—W. F. Fasse; W. G. Fasse

(57) ABSTRACT

A probe (1A) has a cutting blade portion (2) at a tip end that is brought into contact with a pad electrode (5). The cutting blade has a cutting edge that is in a plane parallel to the direction of sliding of the blade over a pad electrode, when the edge is brought into contact with the electrode. The cutting edge (2a) has a sloping or curved shape that comes closer to the electrode from the front side to the rear side of the blade along the direction of sliding. Thus, as the cutting edge (2a) cuts into an insulating coating (7) formed on the surface of the electrode, the probe ensures satisfactory electrical conduction between the probe (1A) and the electrode because it cuts through the coating without causing swarfs.

22 Claims, 9 Drawing Sheets

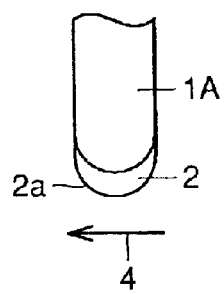
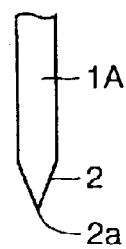
FIG.1A  FIG.1B
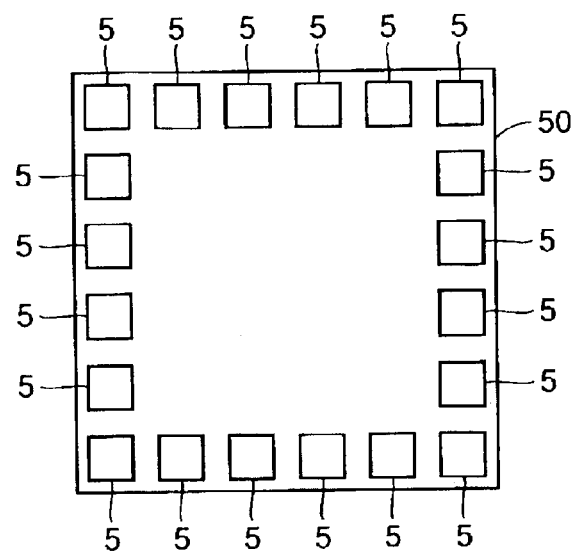
FIG.2

PROBE CARD APPARATUS AND ELECTRICAL CONTACT PROBE HAVING CURVED OR SLOPING BLADE PROFILE

TECHNICAL FIELD

The present invention relates to a probe card apparatus and a probe used therefor, and more specifically, to a probe card apparatus and a probe used therefor providing satisfactory electrical contact with a prescribed electrode portion formed on a semiconductor chip and the like, when a plurality of semiconductor chips formed on a silicon wafer is subjected to an electrical test such as a circuit test, in the form of a wafer, or when circuit elements such as liquid crystal display panels (LCD) and the like are subjected to electrical circuit test.

BACKGROUND ART

A plurality of pad electrodes mainly consisting of aluminum or the like are arranged and formed on a surface of a semiconductor chip, a liquid crystal display panel or the like (hereinafter referred to as an "object of measurement"). For example, when a semiconductor chip in the form of a wafer is to be electrically tested, a probe card for electrically connecting each of the pad electrodes with a prescribed measuring apparatus is used.

Referring to FIG. 18, a probe card 9 includes a substrate 11, a ring 13 and a probe 101. A probe formed of a conductive material such as tungsten or a probe such as disclosed in Japanese Patent Laying-Open No. 10-185951 may be used as probe 101.

A plurality of probes 101 are arranged radially, for example, and supported by the ring 13. Near the center of ring 13, a tip end portion of each probe 101 is brought into contact with each pad electrode 5 of the semiconductor chip formed on a silicon wafer 3. Each probe 101 is supported by epoxy resin 15 at the portion of ring 13.

In an electrical test using such a probe card, as the tip end portion of probe 101 is brought into pressure contact with pad electrode 5 as shown in FIG. 19, electrical contact between probe 101 and pad electrode 5 is established.

When probe 101 is brought into pressure contact with pad electrode 5, pad electrode 5 is pushed up in the direction represented by the arrow, so that probe 101 contacts pad electrode 5. Further, as the pad electrode is pushed up, the tip end portion of probe 101 moves on a circular orbit with the supported portion being the center, as shown by the dotted line 17. At the time of this pressure contact, the tip end portion of probe 101 slides over pad electrode 5, abrading the surface of pad electrode 5.

As pad electrode 5 is formed of a material mainly consisting of aluminum, for example, an aluminum oxide coating tends to be formed on the surface. When the tip end portion of probe 101 abrades the surface of pad electrode 5 as it is brought into pressure contact therewith, the aluminum oxide coating formed on the surface of pad electrode 5 is peeled off, attaining electrical conduction between probe 101 and pad electrode 5.

As described above, electrical conduction between pad electrode 5 having the aluminum oxide coating formed thereon and probe 101 is attained as the surface of pad electrode 5 is abraded by the tip end portion of probe 101 and aluminum oxide coating is peeled off, at the time of pressure contact. In order to attain such an electrical conduction, generally, the tip end portion 101a of probe 101 is made flat as shown in FIG. 20, and a diameter of which is about several tens of microns.

Probe 101 having the flat tip end portion 101a, however, suffers from the problem that small swarfs of the peeled aluminum oxide coating adhere on the tip end portion 101a of probe 101 as the probe abrades the aluminum oxide coating, so that the tip end portion 101a is covered by an insulating film. This hinders satisfactory conduction between probe 101 and pad electrode 5, making an electrical test impossible.

In order to avoid such a problem, it is necessary to remove the swarfs of the aluminum oxide coating adhered to the tip end portion 101a of probe 101 periodically. The time required for maintenance including such a removal operation is wasteful. Further, by the removing operation, the shape of the tip end portion 101a of probe 101 may be deformed, and eventually, satisfactory electrical conduction between probe 101 and pad electrode 5 is lost.

Further, a probe 102 having a conical or triangular pyramid pointed tip end portion such as shown in FIG. 21 has been applied, as a probe to which the swarfs of the aluminum oxide film do not adhere at the tip end portion. Probe 102 with the pointed tip end portion, however, cannot be slid over the pad electrode when brought into pressure-contact with the pad electrode. Therefore, it is necessary to bring probe 102 into contact approximately vertically with the pad electrode.

In that case, it is necessary to exert larger pressure for contact, in order to pierce through the aluminum oxide film formed on the surface of the pad electrode. Further, a complicated structure for positioning the probe vertically becomes necessary.

DISCLOSURE OF THE INVENTION

The present invention was made to solve the above described problems, and a first object is to provide a probe card apparatus having a relatively simple structure and capable of attaining satisfactory electrical contact with a pad electrode. The second object is to provide a probe used for such a probe card apparatus.

According to a first aspect, the present invention provides a first probe card apparatus having a plurality of probes to be brought into contact with an electrode portion of an object of measurement (or test object) to perform an electrical test on the object of measurement, wherein the plurality of probes have cutting blade portions at tip end portions to be in contact with the electrode portions, the cutting blade portions each having a cutting edge in a plane approximately parallel to the direction of sliding relative to the electrode portion when the edge is brought into contact with the electrode portion, and the cutting edge slopes or curves so that it comes closer to the electrode portion from the front side to the rear side along the direction of progress, at a front edge as it slides relative to the electrode portion.

Because of this structure, as the probe is brought into pressure contact with the electrode portion, the cutting edge cuts into the insulating film such as the aluminum oxide coating formed on the surface of the electrode portion. As the probe slides over the electrode portion, the cutting edge continuously cuts and slits the insulating film until it reaches the electrode portion positioned below the insulating film. Accordingly, the cutting blade contacts the electrode portion, ensuring electrical contact between the probe and the electrode portion. Thus, an electrical test of the object of measurement such as the semiconductor chip and a liquid crystal display panel formed on a silicon substrate can be performed satisfactorily. Further, the cutting edge is formed to come closer to the electrode portion from the front side to the rear side along the direction of progress, i.e. the front edge, as it slides relative to the electrode portion, comes closer to the electrode portion from the front side to the rear side along the direction of progress. Therefore, when the cutting edge of the probe slides and slits the insulating film, the insulating film is not peeled off, and hence generation of swarfs or sludge of the insulating film can be suppressed.

Preferably, the plurality of probes are arranged extending outward from positions where the probes are in contact with the electrode portions, and the plane including the cutting edge is approximately parallel to the direction of extension of respective ones of the plurality of probes.

Here, when the electrode portion is pushed up, the cutting edge can easily slide and cut the insulating film and a cutting edge reaches the electrode portion positioned below the insulating film, whereby electrical contact between the probe and the electrode portion can be attained more reliably.

Preferably, in the relative sliding movement of the plurality of probes and the corresponding electrode portions, the planes including the respective cutting edges of the probes are all approximately parallel to the directions of sliding of the respective probes.

Here, even when the pattern of arrangement of the electrode portions formed on the object of measurement is relatively irregular, it is possible to bring the cutting edges to the electrode portions positioned below the insulating film easily, as the probes are put onto the electrode portions from above and the electrode portions and the probes slide relative to each other, whereby electrical contact between the probes and the electrode portions can be attained reliably.

According to a second aspect, the present invention provides a first probe that is used for the first probe card apparatus described above, for performing an electrical test of an object of measurement, when brought into contact with an electrode portion of the object of measurement (or test object), having a cutting blade at a front edge portion to be in contact with the electrode portion. The cutting blade has a cutting edge in a plane parallel to the direction of sliding over the electrode portion when it is brought into contact with the electrode portion. The cutting edge slopes or curves so that it comes closer to the electrode portion from the front side to the rear side along the direction of progress, at the front edge along the direction of progress when it slides over the electrode portion.

By this structure, as already described, the cutting edge of the cutting blade slides, cutting and slitting the insulating film such as the aluminum oxide coating formed on the surface of the electrode portion, and the cutting edge reaches the electrode portion positioned below the insulating film. Thus, electrical contact between the probe and electrode portion can be established reliably. Further, when the cutting edge of the probe slides and cuts the insulating film, the insulating film is not peeled off, and hence generation of swarfs or sludge of the insulating film can be suppressed.

The second probe card apparatus in accordance with the first aspect of the present invention has a plurality of probes that are brought into contact with electrode portions of an object of measurement to perform electrical test of the object of measurement, and the plurality of probes each have a tip end portion to be brought into contact with the electrode portion to cut and slit the surface of the electrode portion. Each tip end portion is in one plane approximately parallel to the direction of sliding relative to the electrode portion when it is brought into contact with the electrode portion, and includes a hooked stylus portion formed to be brought into contact with the electrode portion from the front side to the rear side, facing backward, along the direction of progress as it slides relative to the electrode portion.

By this structure, when the probe is brought into pressure contact with the electrode portion, the hooked stylus portion cuts into the insulating film such as the aluminum oxide coating formed on the surface of the electrode portion. As the probe slides over the electrode portion, the hooked stylus cuts and slits the insulating film and reaches the electrode portion positioned below the insulating film. Thus, the stylus portion reaches the electrode portion, surely establishing electric contact between the probe and the electrode portion. Thus, electrical test of the object of measurement such as the semiconductor chips formed on the silicon substrate can be performed satisfactorily, with the objects being formed on the substrate. Further, as the stylus portion is formed to be brought into contact with the electrode portion from front side to rear side along the direction of progress as it slides, the insulating film is not peeled off while the insulating film is cut, and hence generation of swarfs or sludge of the insulating film can be suppressed.

Further, preferably, the plurality of probes are respectively arranged to extend outward from the positions where the probes are in contact with electrode portions, and the plane including the hooked stylus is positioned approximately parallel to the direction of extension of respective ones of the plurality of probes.

In this case, when the electrode portion is pushed up relatively, the stylus portion easily cuts into the insulating film and reaches the electrode portion positioned below the insulating film, ensuring electrical contact between the probe and the electrode portion with higher reliability.

Further, preferably, the planes including the respective hooked stylus portions of the plurality of probes are positioned relatively parallel to the directions of sliding when the corresponding plurality of probes slide relative to the corresponding electrode portions.

Here, even when the pattern of arrangement of the electrode portions formed on the object of measurement is relatively irregular, the hooked stylus portions of the plurality of probes can easily cut into the insulating film and reach the electrode portions positioned below the insulating film because of the relative sliding movement between the electrode portions and the probes, whereby electrical contact between the probes and the electrode portions can be established reliably.

The second probe in accordance with the second aspect of the present invention is brought into contact with an electrode portion of an object of measurement for performing an electrical test of the object of measurement, and the probe includes a tip end portion to be brought into contact with the electrode portion and cutting the surface of the electrode portion. The tip end portion includes a hooked stylus portion in one plane approximately parallel to the direction of sliding over the electrode portion when the tip end portion is brought into contact with the electrode portion The hooked stylus portion is formed to be brought into contact facing backward with the electrode portion from front side to rear side along the direction of sliding over the electrode portion.

By this structure, as the probe is brought into pressure contact with the electrode portion as described above, the hooked stylus portion cuts into the insulating film. As the probe slides over the electrode portion, the hooked stylus portion cuts and slits the insulating film and reaches the electrode portion positioned, below the insulating film, surely establishing electrical contact between the probe and the electrode portion. Further, as the stylus portion is formed to be brought into contact with the electrode portion from the front side to the rear side along the direction of progress when it slides, the insulating film is not peeled off while the insulating film is cut, and hence generation of swarfs or sludge of the insulating film can be suppressed.

BRIEF DESCRIPTION OF THE DRAWINGS

FIG. 1A is an enlarged side view showing a cutting edge of the probe used for the probe and the probe card in accordance with the first embodiment of the present invention.

FIG. 1B is another side view of the cutting edge shown in FIG. 1A.

FIG. 2 is a plan view showing an example of an arrangement of the pad electrodes in the same embodiment.

BEST MODES FOR CARRYING OUT THE INVENTION

First Embodiment

The probe in accordance with the first embodiment of the present invention will be described. Referring to FIGS. 1A and 1B, probe 1A in accordance with the first embodiment of the present invention has a cutting blade portion 2 at the tip end portion that is brought into contact with a pad electrode. Cutting blade portion 2 has a cutting edge 2a, which is in one plane parallel to the direction of sliding (arrow 4) relative to the pad electrode, when the cutting blade is brought into contact with the pad electrode.

Particularly, cutting edge 2a curves as seen in FIG. 1A so that it becomes closer to the pad electrode portion from the front side to the rear side, along the direction of progress, at the front edge in the direction of progress when it slides over the pad electrode.

Figure 18:
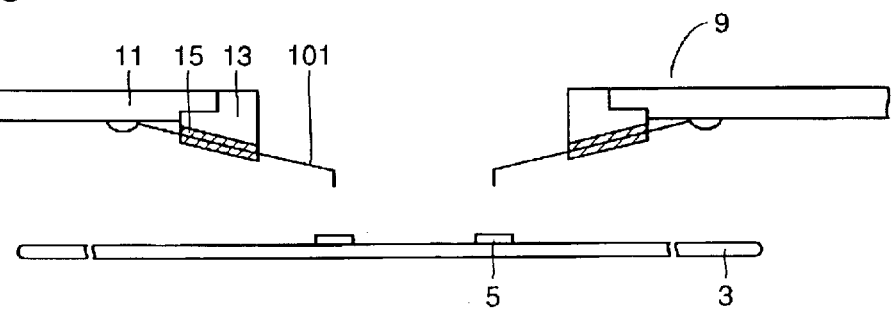
FIG. 18 is a cross sectional view showing a conventional probe card.
Figure 19:
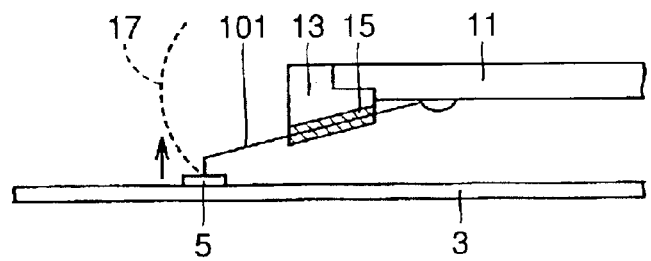
FIG. 19 is a partially enlarged view of the conventional probe card.
Figure 20:
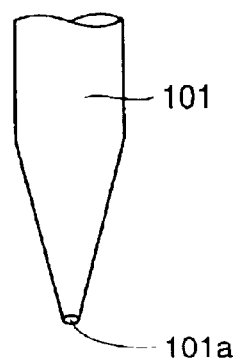
FIG. 20 is an enlarged view of the tip end portion of the probe used in the conventional probe card.
Figure 21:
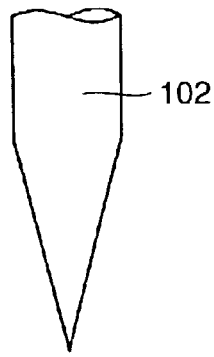
FIG. 21 is an enlarged view of the tip end portion of another probe used in the conventional probe card.

Next, a probe card in accordance with the first embodiment of the present invention that includes probe 1A will be described. The probe card is similar to the probe card shown in FIG. 18, except for probe 101. More specifically, on the probe card, a plurality of probes 1A are arranged radially and supported by a ring 13.

Near the center of ring 13, tip end portions of respective probes 1A are brought into contact with respective pad electrodes 5 of a semiconductor chip formed on a silicon wafer 3. The planes including cutting edges 2a of the plurality of probes 1A are approximately parallel to the direction of extension of respective probes 1A.

When an electrical test is to be performed using the probe card, pad electrodes arranged regularly at an outer peripheral portion of the semiconductor chip 50 formed on a silicon wafer, such as shown in FIG. 2, for example, are preferred.

The operation using the probe card will be described. In an electrical test using such a probe card, first, probe 1A is brought into pressure contact with pad electrode 5 as shown in FIGS. 3 and 4, so that an aluminum oxide coating 7 formed on the surface of pad electrode 5 is cut by the cutting edge 2a.

Figure 5:
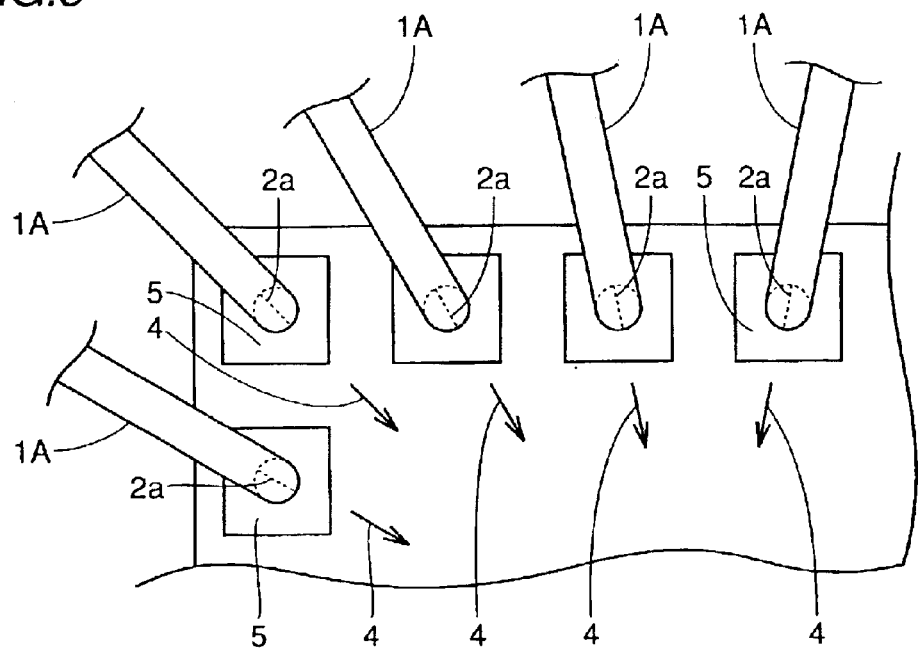
FIG. 5 is a plan view showing the state of contact between the probes and respective pad electrodes, illustrating the operation of the probe card in the same embodiment.

Further, as pad electrode 5 is pushed up, each probe 1A slides in the direction along the arrow 4 relative to pad electrode 5, that is, the direction of extension of each probe 1A, as shown in FIG. 5. At this time, as the plane including the cutting edge 2a is approximately parallel to the direction of extension of each probe, the cutting edge 2a easily slides while cutting and slitting aluminum oxide coating 7, and a cutting edge 2a reaches pad electrode 5 of aluminum, positioned below aluminum oxide coating 7.

Thus, cutting edge 2a is brought into contact with pad electrode 5, surely establishing electrical contact between probe 1A and pad electrode 5. As a result, a semiconductor chip (not shown) formed on the silicon substrate 3 can be electrically tested satisfactorily, in the form of a wafer.

Figure 3:
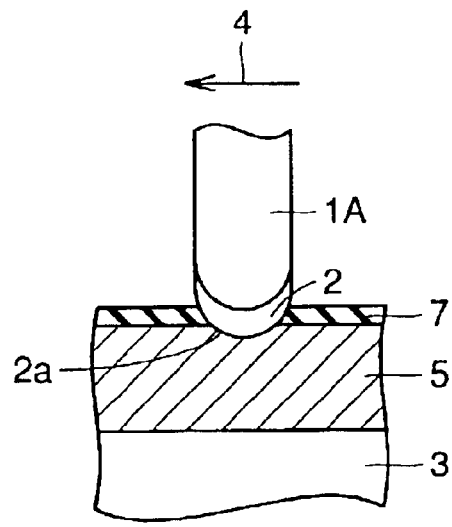
FIG. 3 is a cross section illustrating an operation of the probe card in the same embodiment.
Figure 4:
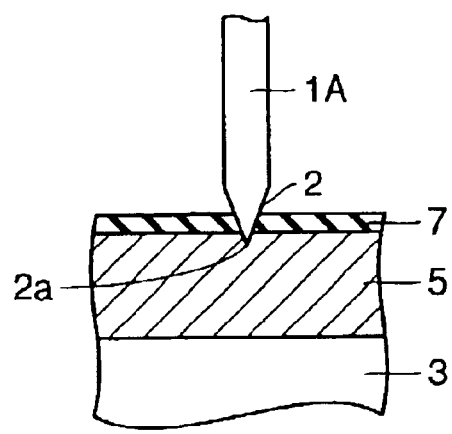
FIG. 4 is another cross section illustrating the operation of the probe card in the same embodiment.

Further, as the cutting edge 2a of probe 1A, comes closer to the pad electrode from the front side to the rear side along the direction of progress at the front edge as it slides over pad electrode 5, that as shown in FIG. 3, the cutting edge 2a cuts and slits aluminum oxide coating 7 without peeling or abrading the coating. Therefore, swarfs or sludges of aluminum oxide coating 7 are not generated. As a result, more satisfactory electrical conduction between probe 1A and pad electrode 5 can be attained.

In the present embodiment, a cutting edge 2a having an approximately arcuate shape in one plane parallel to the direction of sliding, such as shown in FIG. 1A, is described as an example of the cutting edge 2a of probe 1A.

Figure 6A:
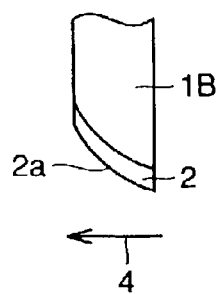
FIG. 6A is an enlarged side view showing a cutting edge of the probe in accordance with a first modification of the embodiment.
Figure 6B:
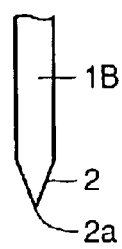
FIG. 6B is another side view of the cutting edge shown in FIG. 6A.
Figure 7A:
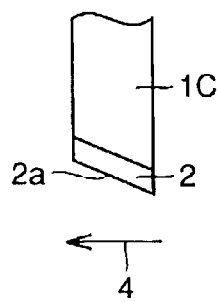
FIG. 7A is an enlarged side view showing a cutting edge of the probe in accordance with a second modification.
Figure 7B:
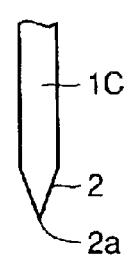
FIG. 7B is another side view of the cutting edge shown in FIG. 7A.

Other than the above described arcuate shape, the first modification of the probe may include a probe 1B having a cutting edge 2a that curves downward from a front side to a rear side in one plane parallel to the direction (arrow 4) of sliding such as shown in FIGS. 6A and 6B, and the second modification may include a probe 1C having a cutting edge 2a that slopes linearly downward from a front side to a rear side in one plane parallel to the direction (arrow 4) of sliding such as shown in FIGS. 7A and 7B.

In this manner, as the cutting edge 2a of probes 1A to 1C comes closer to pad electrode 5 from the front side to the rear side along the direction of progress of sliding, at the front edge as it slides over pad electrode 5, the cutting edge 2a can be prevented from peeling or abrading aluminum oxide coating 7. Thus, satisfactory electrical conduction between the probe and pad electrode 5 is attained.

Figure 8:
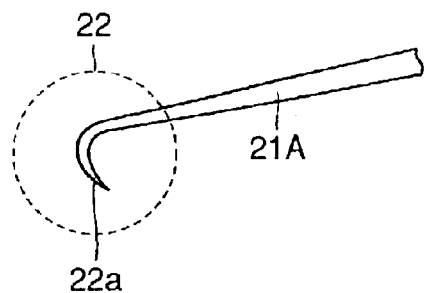
FIG. 8 is a side view showing a probe in accordance with a third modification of the embodiment.

A third modification of the probe will be described in the following. Referring to FIG. 8, the probe 21A has a tip end portion 22 that is brought into contact with the pad electrode, in one plane approximately parallel to the direction of sliding relative to the pad electrode, when the probe is brought into contact with the pad electrode. The tip end portion 22 has a hooked stylus portion 22a formed to be brought into contact with the pad electrode from the front side to the rear side along the direction of progress as it slides over the pad electrode. The shape of the stylus portion 22a may be a cone, a triangular pyramid, a polygonal pyramid or the like.

When the probe card including the probes 21A described above is used, the tip end portion 22 of each probe 21A is brought into contact with each of the pad electrodes 5 of the semiconductor chip formed on silicon wafer 3. Planes including the tip end portions 22 having the hooked stylus portions 22a of the plurality of probes 21A are approximately parallel to the direction of extension of respective probes 21A.

Figure 9:
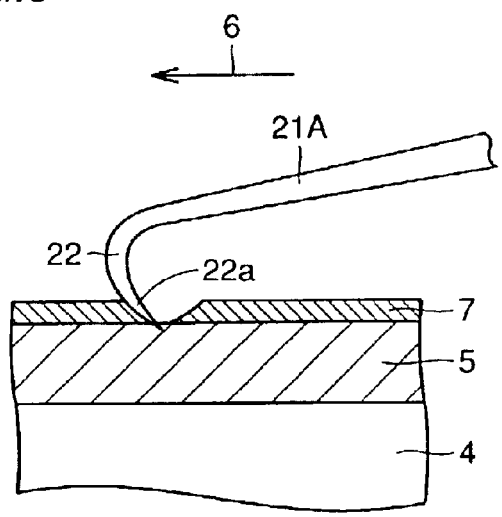
FIG. 9 is a cross section illustrating an operation of the probe card having the probe in accordance with the third modification of the embodiment.
Figure 10:
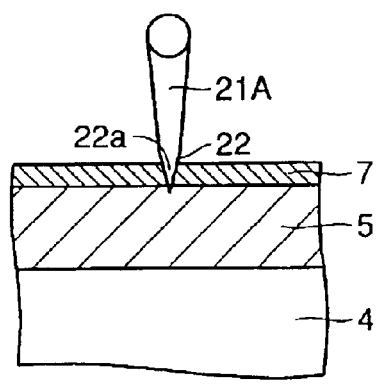
FIG. 10 is another cross section illustrating the operation of the probe card including the probe in accordance with the third modification of the embodiment.

In the electrical test using such a probe card, first, probe 21A is brought into pressure contact with pad electrode 5 as shown in FIGS. 9 and 10, so that the stylus portion 3 cuts into aluminum oxide coating 7 formed on the surface of pad electrode 5.

Figure 11:
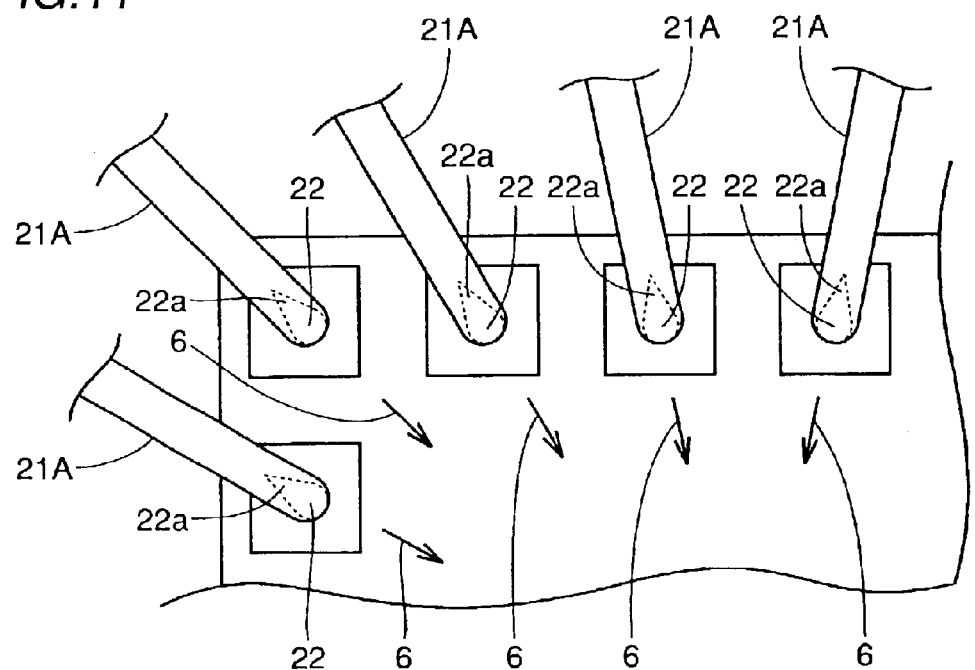
FIG. 11 is a plan view representing the state of contact between the probes and respective pad electrodes, illustrating an operation of the probe card including the probes in accordance with the third modification of the embodiment.

Then, as shown in FIG. 11, pad electrode 5 is pushed up, so that respective probes 21A slide in the direction represented by the arrows 6, that is, along the directions of extension of respective probes 21A. At this time, as the plane including the tip end portion 22 having stylus portion 22a is approximately parallel to the direction of extension of the corresponding probe, hooked stylus portion 22a easily cuts and slits aluminum oxide coating 7 while it slides, and reaches pad electrode 5 positioned below aluminum oxide coating 7, as shown in FIG. 9.

Thus, electrical contact between the probe 21A and pad electrode 5 is established reliably, and the semiconductor chip (not shown) formed on the silicon substrate 3 can be electrically tested satisfactorily, in the wafer state.

Further, as the stylus portion 22a is formed to be brought into contact with pad electrode 5 from the front side to the rear side, facing backward, along the direction of progress as it slides over pad electrode 5, aluminum oxide coating 7 is not peeled when aluminum oxide coating 7 is cut, and hence generation of swarfs or sludge of aluminum oxide coating 7 can be suppressed. Thus, electrical conduction between the probe 21A and pad electrode 5 can be attained more satisfactorily.

Figure 12:
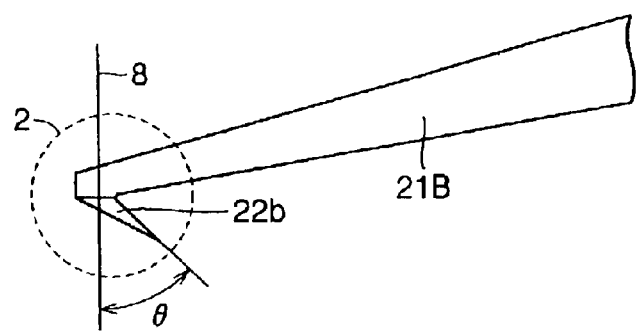
FIG. 12 is a side view showing a probe in accordance with a fourth modification of the embodiment.

In the third modification described above, a probe 21A having a curved tip end portion 22 such as shown in FIG. 8 has been described as an example. As a fourth modification, as shown in FIG. 12, a probe 21B having a tip end portion 22 with a stylus portion 22b folded or bent by an angle θ with respect to a vertical line 8 approximately perpendicular to the surface of the pad electrode may be applied, to attain similar effects as the probe 21A in accordance with the third modification.

Though pad electrode 5 is pushed up in the above described embodiment, the probe card may be brought closer to pad electrode 5. As the pad electrode and the probe card are brought closer to each other, relative sliding movement of the pad electrode and probe occurs, establishing satisfactory electrical conduction between respective probes and pad electrodes.

Second Embodiment

In the first embodiment, a probe card having a plurality of probes arranged radially has been described as an example. Such a probe card is applied when the pad electrodes formed on the semiconductor chip are arranged relatively regularly, as shown in FIG. 2, for example.

Figure 13:
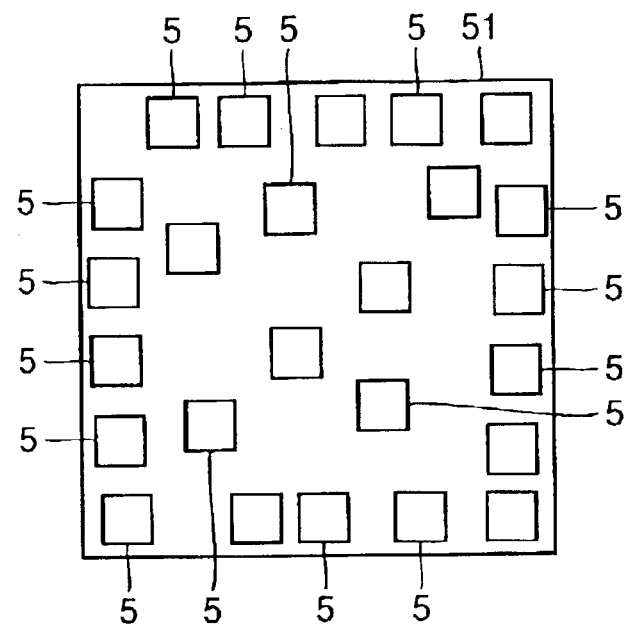
FIG. 13 is a plan view showing an example of the arrangement of pad electrodes to which the probe card in accordance with the second embodiment of the present invention is applied.

In the present embodiment, a probe card will be described that can be applied to such a semiconductor chip 51 on which pad electrodes 5 are arranged relatively irregularly, as shown in FIG. 13, for example.

It is physically difficult to electrically test the semiconductor chip 51 on which pad electrodes 5 are arranged irregularly by means of a probe card having a plurality of probes arranged radially. Therefore, the probe card of the present embodiment has a plurality of probes 1D arranged to prick each pad electrode 5 approximately vertically. Further, all the planes including the cutting edges 2a at the tip end of probe 1D are arranged approximately parallel to one direction. The direction is approximately the same as the direction of sliding the silicon substrate, as will be described later.

Figure 14:
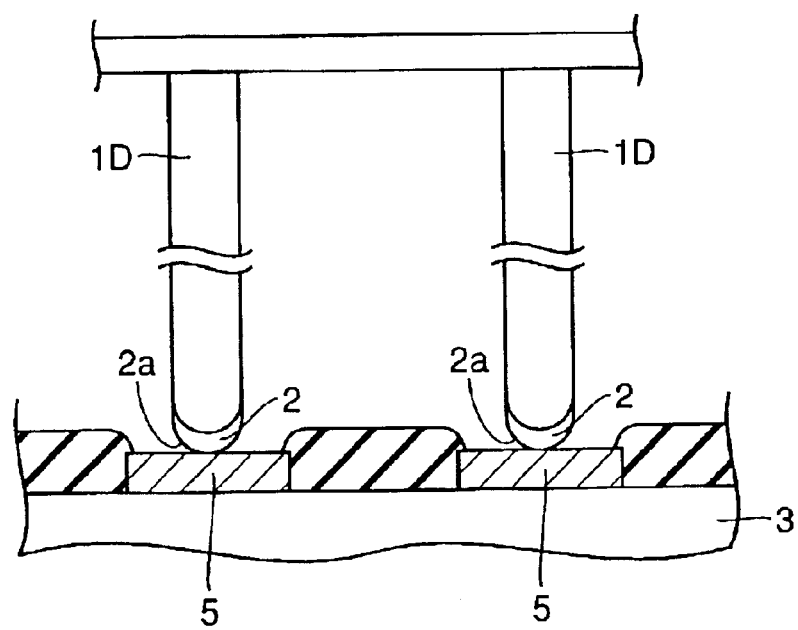
FIG. 14 is a cross section illustrating an operation of the probe and the probe card including the probe, in accordance with the second embodiment of the present invention.

The operation using such a probe card will be described in the following. In an electrical test using the probe card according to FIG. 14, first, as shown in FIGS. 3 and 4, probe 1D is brought into pressure contact with pad electrode 5, so that the cutting edge 2a cuts into aluminum oxide coating 7 formed on the surface of pad electrode 5.

Figure 15:
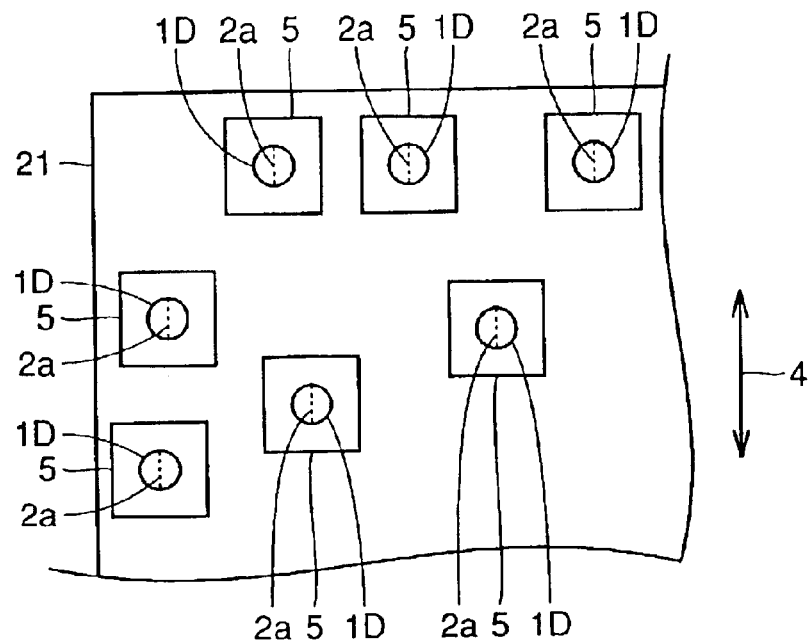
FIG. 15 is a plan view representing the state of contact between the probes and respective pad electrodes, illustrating the operation of the probe card of the same embodiment.

Thereafter, the silicon substrate on which pad electrode 5 is formed is slid in one direction as represented by the arrow 4, for example, as shown in FIG. 15. More specifically, each probe 1D and pad electrode slide relative to each other. At this time, planes including the cutting edges 2a of probes 1D are all approximately parallel to the direction of sliding of the silicon substrate (arrow 4), so that cutting edge 2a easily slides while cutting and slitting the aluminum oxide film 7, and a cutting edge 2a reaches pad electrode 5 of aluminum, positioned below aluminum oxide coating 7.

Thus, cutting edge 2a contacts pad electrode 5, surely establishing electrical contact between probe 1D and pad electrode 5. As a result, the semiconductor chip (not shown) formed on silicon substrate 3 can be electrically tested satisfactorily, in the wafer state.

As already described in the first embodiment, probe 1D also has the cutting edge 2a formed to come closer to pad electrode 5 from the front side to the rear side along the direction of progress of sliding, at the front edge as it slides over pad electrode 5, that. Accordingly, cutting edge 2a can cut and slit aluminum oxide coating 7 without peeling or abrading, and hence generation of swarfs or sludges of aluminum oxide coating 7 can be prevented. Thus, electrical conduction between probe 1D and pad electrode 5 can be attained more satisfactorily.

A modification of the probe above will be described in the following.

Figure 16:
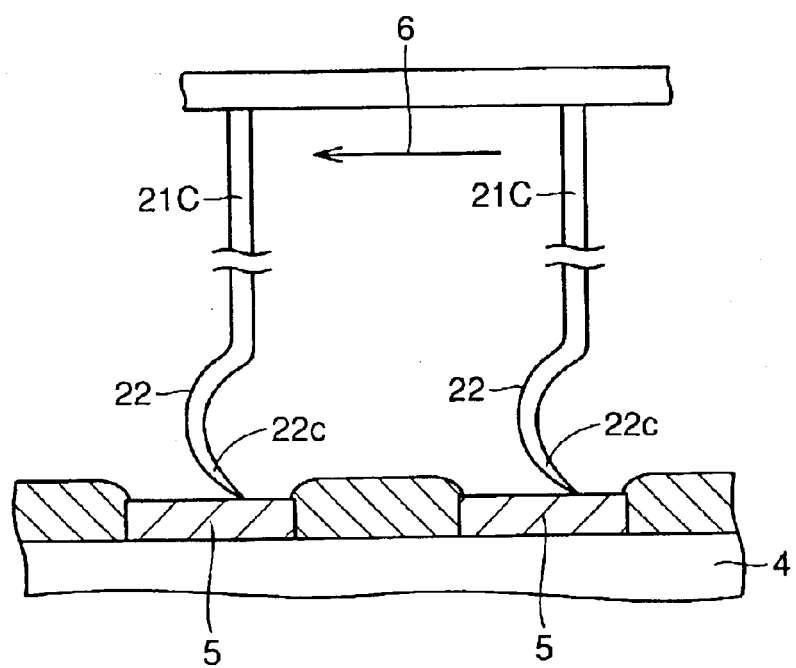
FIG. 16 is a cross section illustrating an operation of the probe card including the probe in accordance with a modification of the same embodiment.

Referring to FIG. 16, a probe 21C in accordance with one modification has a hooked stylus portion 22c at tip end portion 22.

In the probe card including a plurality of probes 21C, each probe 21C is arranged such that the probe pricks pad electrode 5 approximately vertically, while the stylus portion 22c is brought into contact with the pad electrode in a direction crossing the vertical direction. More specifically, the stylus portion 22c is formed to be brought into contact with pad electrode 5 from the front side to the rear side, facing backward, along the direction of progress as it slides over pad electrode 5.

Further, all the planes including the tip end portions 22 are approximately parallel to the direction of sliding of the silicon substrate along one direction.

In an electrical test using such a probe card, first, probe 21C is brought into pressure contact with pad electrode 5, so that the stylus portion 22c cuts into the aluminum oxide film 7 formed on the surface of pad electrode 5.

Thereafter, referring to FIG. 16, the silicon substrate on which pad electrode 5 is formed is slid in one direction, so that respective probes 21C slide over the pad electrodes 5, in the direction represented by the arrow 6.

Figure 17:
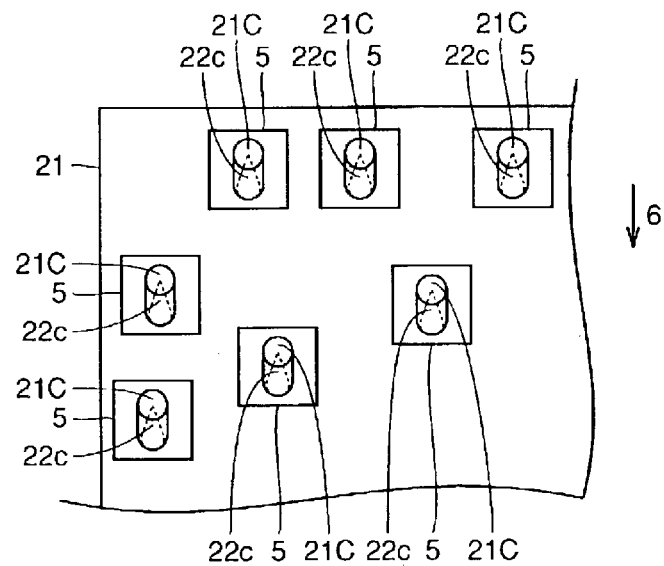
FIG. 17 is a plan view representing the state of contact between the probes and the respective pad electrodes, illustrating an operation of the probe card including the probes in accordance with a modification of the same embodiment.

At this time, as all the planes including tip end portions 22 having the stylus portions 22c of the probe 21C approximately correspond to the sliding direction (arrow 6), as shown in FIG. 17, stylus portions 22c can easily cut and slit aluminum oxide coating 7 while sliding, and the stylus portions 22c reach the pad electrodes 5 of aluminum positioned below aluminum oxide coating 7.

Further, as the stylus portion 22c is formed to be brought into contact with pad electrode 5 from the front side to the rear side, facing backward, along the direction of progress as it slides over pad electrode 5, the stylus portion 22c can cut and slit aluminum oxide coating 7 without peeling or abrading the coating. Therefore, generation of swarfs or sludges of aluminum oxide coating 7 can be prevented. As a result, electrical contact between probe 21C and pad electrode 5 can be established more satisfactorily.

As compared with the conventional probe card in which the stylus portion pricks the pad electrode approximately vertically, sliding of the stylus portion over the pad electrode is facilitated, as the stylus portion 22c is formed such that it is brought into contact with pad electrode 5 from the front side to the rear side, facing backward, along the direction of progress as it slides over pad electrode 5.

Thus, the semiconductor chip (not shown) formed on the silicon substrate 4 can be electrically tested satisfactorily, in the wafer state.

In each of the above described embodiments, probes 1A to 1C having cutting edges processed as shown in FIGS. 1, 6 and 7, and probes 21A to 21C having hooked stylus portions 22a to 22c such as shown in FIGS. 8, 12 and 16 have been described.

Additionally, the tip end portion having such a cutting edge 2a as shown in FIG. 1, 6 or 7 may be fabricated in advance and attached to the conventional probe, to attain satisfactory conduction between the probe and the pad electrode. Similarly, a tip end portion having such a stylus portion as shown in FIG. 8, 12 or 16 may be fabricated in advance and attached to the conventional probe, to attain satisfactory conduction between the probe and the pad electrode.

Though a pad electrode formed of aluminum has been described as an example of the pad electrode, the probe may be applied to a pad electrode formed of a metal other than aluminum, to cut an insulating film such as a natural oxide film formed on the surface of the metal, whereby satisfactory electrical conduction between the probe and pad electrode can be attained.

Though a semiconductor chip formed on a silicon substrate has been described as an example as the object of measurement in the embodiment described above, the probe card may be applied to perform electrical test on a liquid crystal display panel. Further, the probe card may be applied not only to the semiconductor chips and liquid crystal display panels but also to electrical test of objects of measurement that have electrode portions allowing electrical test.

Although the present invention has been described and illustrated in detail, it is clearly understood that the same is by way of illustration and example only and is not to be taken by way of limitation, the spirit and scope of the present invention being limited only by the terms of the appended claims.

INDUSTRIAL FIELD OF APPLICABILITY

The present invention is applied as a probe used for conducting a circuit test or the like of a semiconductor chip in the wafer state or a liquid crystal display panel (LCD), wherein the probe has a structure attaining satisfactory electrical contact with a prescribed electrode portion formed on the semiconductor chip or the like.

What is claimed is:

1. A probe card apparatus having a plurality of probes (1A to 1D) that are brought into contact with electrode portions (5) of an object of measurement, for performing an electrical test of the object of measurement, wherein said probes (1A–1D) respectively include cutting blade portions (2) having a cutting edge (2a) of a shape continuous in one direction, said cutting blade portions being provided at tip end portions of said probes and being brought into contact with said electrode portions (5), respectively;

at said cutting blade portions (2), said cutting edges (2a) are each formed such that each respective one of said cutting edges is respectively in a plane approximately parallel to a direction of sliding of said respective cutting edge relative to a respective one of said electrode portions (5) when each of said plurality of probes (1A to 1D) is in contact with said electrode portions (5); and each respective one of said cutting edges (2a) has a continuous shape in a height direction, said shape coming closer to said respective electrode portion (5) from a front side of said cutting edge toward a rear side of said cutting edge along the direction of sliding as each of said probes (1A to 1D) slides relative to, and with said cutting edge in contact with, said electrode portion (5).

2. The probe card apparatus according to claim 1, wherein said probes (1A–1D) are arranged extending outward in respective extension directions from contact positions at which said cutting edges contact said electrode portions (5), and planes including said cutting edges (2a) are approximately parallel to said extension directions of of said probes (1A–1D) respectively.

3. The probe card apparatus according to claim 1, wherein planes including said cutting edges (2a) of are respectively approximately parallel to the direction of sliding.

4. A probe brought into contact with an electrode portion (5) of an object of measurement, for performing an electrical test of the object of measurement, comprising:

a cutting blade portion (2) at a tip end portion of said probe brought into contact with the electrode portion (5); wherein said cutting blade portion (2) has a cutting edge (2a) of a shape continuous in one direction, in one plane, said shape of said cutting edge (2a), with respect to a height direction, comes closer to said electrode portion (5) from a front side of said cutting edge toward a rear side of said cutting edge along a direction of sliding of said cutting edge relative to and in contact with said electrode portion (5).

5. An electrical contact probe for electrically contacting an electrode of a test object that is to be electrically tested, said probe comprising a probe body and a cutting blade with a cutting edge provided at a tip end portion of said probe body, wherein:

said cutting blade protrudes from said probe body in a protrusion direction adapted to be directed toward the electrode so that said cutting edge is adapted to physically and electrically contact the electrode;

said cutting edge extends along a cutting plane;

in said cutting plane, said cutting edge has a continuous cutting edge shape extending from a front side to a rear side of said cutting blade;

said cutting edge includes a cutting edge tip that protrudes farthest of all of said cutting edge in said protrusion direction;

in said cutting plane, said cutting edge tip is displaced away front said front side of said cutting blade along said cutting edge; and at said front aide of said cutting blade, said cutting edge protrudes less far than said cutting edge tip in said protrusion direction.

6. The electrical contact probe according to claim 5, wherein said cutting edge tip is located displaced from and between said front side and said rear side of said cutting blade along said cutting edge in said cutting plane.

7. The electrical contact probe according to claim 6, wherein said cutting edge tip is located centrally between said front side and said rear side of said cutting blade along said cutting edge in said cutting plane.

8. The electrical contact probe according to claim 6, wherein said cutting edge shape in said cutting plane is symmetrical about said cutting edge tip toward said front side and toward said rear side of said cutting blade.

9. The electrical contact probe according to claim 6, wherein said cutting edge shape is a continuous arcuate curved shape from said front side to said rear side of said cutting blade.

10. The electrical contact probe according to claim 5, wherein said cutting edge shape curves in said cutting plane from said front side of said cutting blade to said cutting edge tip.

11. The electrical contact probe according to claim 10, wherein said cutting edge tip is located at said rear side of said cutting blade along said cutting edge in said cutting plane.

12. The electrical contact probe according to claim 10, wherein said cutting edge shape curves convexly outwardly in said protrusion direction in said cutting plane from said front side of said cutting blade to said cutting edge tip.

13. The electrical contact probe according to claim 5, wherein said cutting edge shape extends linearly in said cutting plane from said front aide of said cutting blade to said cutting edge tip.

14. The electrical contact probe according to claim 13, wherein said cutting edge tip is located at said rear side of said cutting blade along said cutting edge in said cutting plane.

15. The electrical contact probe according to claim 5, wherein said cutting edge tip is located at said rear side of said cutting blade along said cutting edge in said cutting plane.

16. The electrical contact probe according to claim 5, wherein said cutting edge is formed along an intersection of two cutting blade flanks of said cutting blade that taper to said cutting edge at an acute angle relative to each other in a plane perpendicular to said cutting plane.

17. A combination of the electrical contact probe according to claim 5 and the test object that is to be electrically tested, wherein said electrical contact probe is arranged relative to said test object so that said cutting edge is brought physically and electrically into contact with said electrode of said test object while said cutting blade and said electrode undergo a relative sliding motion in a sliding direction parallel to said cutting plane with said cutting blade advancing toward said front side of said cutting blade relative to said electrode.

18. The combination according to claim 17, wherein said cutting edge tip contacts said electrode, while said cutting edge at said front side of said cutting blade does not contact said electrode.

19. The combination according to claim 17, comprising a plurality of said electrical contact probes, wherein said test object has a plurality of said electrodes, and said cutting edge of each respective one of said probes is in contact with a respective one of said electrodes.

20. The combination according to claim 19, wherein said probe bodies are respectively elongated and extend in respective extension directions that radiate outwardly from said electrodes and that are not parallel to each other, and wherein said cutting planes of said probes respectively extend individually parallel respectively to said extension directions.

21. The combination according to claim 20, wherein said sliding directions of said probes respectively extend individually parallel respectively to said cutting planes of said probes.

22. The combination according to claim 19, wherein said cutting planes of said probe are all respectively parallel to each other and said sliding directions of said probes are all respectively parallel to each other and to said cutting planes.

* * * * *

UNITED STATES PATENT AND TRADEMARK OFFICE
CERTIFICATE OF CORRECTION

PATENT NO. : 6,842,023 B2
DATED : January 11, 2005
INVENTOR(S) : Yoshida et al.

It is certified that error appears in the above-identified patent and that said Letters Patent is hereby corrected as shown below:

Title page,
Item [57], ABSTRACT,
Line 3, after "edge" insert -- (2a) --.

Column 4,
Line 60, after "electrode" replace "portion The", by -- portion. The --.

Column 5,
Line 3, after "portion" replace "positioned,", by -- positioned --.

Column 9,
Line 8, after "pad" replace "electrode 5, that.", by -- electrode 5. --.

Column 11,
Line 10, after "directions" delete "of" (first occurrence);
Line 13, after "edges (2a)" delete "of";
Line 48, after "front" replace "aide", by -- said --.

Signed and Sealed this

Twenty-fourth Day of May, 2005

JON W. DUDAS
*Director of the United States Patent and Trademark Office*